(12) United States Patent
Oh et al.

(10) Patent No.: US 9,761,834 B2
(45) Date of Patent: Sep. 12, 2017

(54) COMPOSITION FOR FORMING POLYMER FILM, POLYMER FILM PREPARED USING THE SAME, AND ELECTRONIC DEVICE INCLUDING THE POLYMER FILM

(71) Applicants: SAMSUNG DISPLAY CO., LTD., Yongin-si, Gyeonggi-do (KR); SOGANG UNIVERSITY RESEARCH FOUNDATION, Seoul (KR)

(72) Inventors: Hyunjoon Oh, Yongin-si (KR); Boa Kim, Yongin-si (KR); Sangil Park, Yongin-si (KR); Hyejin Oh, Yongin-si (KR); Jeoungsub Lee, Yongin-si (KR); Minhoon Choi, Yongin-si (KR); Heewoo Rhee, Seoul (KR); Sungmin Cho, Seoul (KR)

(73) Assignees: Samsung Display Co., Ltd., Yongin-si (KR); Sogang University Research Foundation, Seoul (KR)

( * ) Notice: Subject to any disclaimer, the term of this patent is extended or adjusted under 35 U.S.C. 154(b) by 0 days.

(21) Appl. No.: 15/063,409

(22) Filed: Mar. 7, 2016

(65) Prior Publication Data
US 2017/0037277 A1 Feb. 9, 2017

(30) Foreign Application Priority Data
Aug. 7, 2015 (KR) .......................... 10-2015-0111635

(51) Int. Cl.
*C08K 3/36* (2006.01)
*H01L 51/52* (2006.01)
(Continued)

(52) U.S. Cl.
CPC .......... *H01L 51/5253* (2013.01); *C08K 3/36* (2013.01); *C08K 9/06* (2013.01); *C08L 83/04* (2013.01);
(Continued)

(58) Field of Classification Search
None
See application file for complete search history.

(56) References Cited

U.S. PATENT DOCUMENTS 2,705,206 A * 3/1955 Wagner ................. C01B 33/126
106/2
2,705,222 A * 3/1955 Wagner ................... B01J 21/00
106/287.34
(Continued)

FOREIGN PATENT DOCUMENTS

KR 10-2009-0050018 A 5/2009

OTHER PUBLICATIONS

Rozga-Wijas et al. "Branched functionalized polysiloxane-silica hybrids for immobilization of catalysts" J. Mater. Chem. 2003, 13, 2301-2310.*

(Continued)

*Primary Examiner* — Robert S Loewe
(74) *Attorney, Agent, or Firm* — Lewis Roca Rothgerber Christie LLP

(57) ABSTRACT

Embodiments of the present disclosure provide a composition for forming a polymer film, a polymer film prepared therewith, and an electronic device including the polymer film. The composition for forming a polymer film may include an inorganic particle grafted with an organosiloxane polymer represented by Formula 1; and a polymer matrix having a vinylene-based repeating unit:

(Continued)

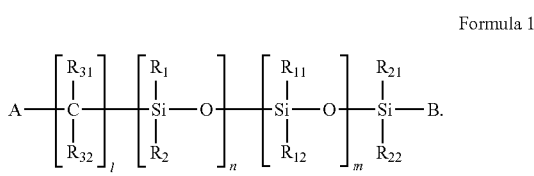

Formula 1

In Formula 1, A may be a moiety grafted to the inorganic particle, B may be a moiety capable of reacting with the polymer matrix, $R_1$ and $R_2$ may each independently be selected from an alkyl group and alkoxy group, $R_{11}$, $R_{12}$, $R_{21}$, $R_{22}$, $R_{31}$, and $R_{32}$ may each independently be selected from moiety B, an alkyl group, and an alkoxy group, and l, n, and m may denote the numbers of respective repeating units.

20 Claims, 7 Drawing Sheets

(51) Int. Cl.
| | |
|---|---|
| *H01L 51/00* | (2006.01) |
| *H01L 51/10* | (2006.01) |
| *H01L 51/44* | (2006.01) |
| *C08K 9/06* | (2006.01) |
| *C08L 83/04* | (2006.01) |
| *C09D 5/44* | (2006.01) |
| *C08G 77/12* | (2006.01) |
| *C08G 77/14* | (2006.01) |

(52) U.S. Cl.
CPC ........ *H01L 51/0094* (2013.01); *H01L 51/107* (2013.01); *H01L 51/448* (2013.01); *C08G 77/12* (2013.01); *C08G 77/14* (2013.01); *C09D 5/448* (2013.01); *C09D 5/4419* (2013.01); *H01L 51/0034* (2013.01)

(56) References Cited

U.S. PATENT DOCUMENTS

| | | | | | |
|---|---|---|---|---|---|
| 3,881,536 | A | * | 5/1975 | Doran, Jr. | C08C 19/25 152/209.1 |
| 4,230,815 | A | * | 10/1980 | Itoh | C08C 19/25 525/101 |
| 5,194,649 | A | * | 3/1993 | Okawa | C07F 7/0858 556/451 |
| 5,686,641 | A | * | 11/1997 | Okawa | C07F 7/0849 556/425 |
| 2004/0198924 | A1 | * | 10/2004 | Young | G02B 1/04 525/474 |
| 2009/0121180 | A1 | | 5/2009 | Tsubokawa et al. | |
| 2009/0306263 | A1 | * | 12/2009 | Taguchi | C08L 83/04 524/404 |
| 2010/0178512 | A1 | * | 7/2010 | Giesenberg | B29C 70/64 428/405 |
| 2011/0098420 | A1 | * | 4/2011 | Takizawa | C08L 83/04 525/477 |
| 2011/0278640 | A1 | * | 11/2011 | Motallebi | H01L 33/56 257/100 |
| 2013/0041098 | A1 | | 2/2013 | Arkles et al. | |
| 2015/0014727 | A1 | * | 1/2015 | Tchoul | C08K 9/08 257/98 |

OTHER PUBLICATIONS

Mandal et al. "Production of Hollow Polymeric Microspheres by Surface-Confined Living Radical Polymerization on Silica Templates" Chem. Mater. 2000, 12, 3481-3487.*
Avolio, R. et al., Synthesis and Characterization of Poly(methylmethacrylate)/Silica Nanocomposites: Study of the Interphase by Solid-State NMR and Structure/Properties Relationships, Journal of Polymer Science: Part A: Polymer Chemistry, 2010, pp. 5618-5629, vol. 48, Wiley Periodicals, Inc.
Etienne, S. et al., Effects of Incorporation of Modified Silica Nanoparticles on the Mechanical and Thermal Properties of PMMA, Journal of Thermal Analysis and Calorimetry, 2007, pp. 101-104, vol. 87, No. 1, Akadémiai Kiadó, Budapest, Hungary.
Goff, J. et al., Silicone Elastomers by Step-Growth Polymerization of Monodisperse Dual Functional Silicones, Polymer Preprints, 2012, pp. 486-487, vol. 53, No. 1, American Chemical Society.
Li, W. et al., Morphology and Rheological Properties of Silica-Filled Poly(carbonate)/Poly(methyl methacrylate) Blends, Polymer Engineering and Science, Society of Plastics Engineers, 2015, pp. 1951-1959, vol. 55, Wiley Periodicals, Inc.
Liu, Y.L. et al., Poly(dimethylsiloxane) Star Polymers Having Nanosized Silica Cores, Macromolecular Rapid Communications, 2004, pp. 1392-1395, vol. 25, Wiley-VCH Verlag GmbH & Co. KGaA, Weinheim, Germany.
Malcolm, D., Top Tech Trends and Predictions for 2013, Connected Rogers News, Webpage: http://www.connectedrogers.ca/news/ces-trends-predictions-for-2013/, Jan. 18, 2013, 4 Pages, Rogers Publishing Limited.
Paquien, J.N. et al., Rheological studies of fumed silica-polydimethylsiloxane suspensions, Colloids and Surfaces A: Physicochemical and Engineering Aspects, 2005, pp. 165-172, vol. 260, Elsevier B.V.
Shintani, K. et al., A facile synthesis of hydro- and vinyl-functionalized di- and tetrasiloxanes and polyaddition via hydrosilylation, Polymer Bulletin, 1996, pp. 705-710, vol. 37, Springer-Verlag.
Geeky Gadgets, Webpage: http://www.geeky-gadgets.com/wp-content/uploads/2010/05/sony-rollable-oled-display2, Printed Nov. 4, 2015, 1 Page.
Tech Blog, CES 2009: Samsung Debuts World's First Foldable AMOLED Display, Webpage: http://www.techeblog.com/index.php/tech-gadget/ces-2009-samsung-debuts-world-s-first-foldable-amoled-display, Jan. 8, 2009, 1 Page.

* cited by examiner

COMPOSITION FOR FORMING POLYMER FILM, POLYMER FILM PREPARED USING THE SAME, AND ELECTRONIC DEVICE INCLUDING THE POLYMER FILM

CROSS-REFERENCE TO RELATED APPLICATIONS

This application claims priority to and the benefit of Korean Patent Application No. 10-2015-0111635, filed on Aug. 7, 2015, in the Korean Intellectual Property Office, the entire content of which is incorporated herein by reference.

BACKGROUND

1. Field

One or more aspects of example embodiments of the present disclosure relate to a composition for forming a polymer film, a polymer film prepared using the same, and an electronic device including the polymer film.

2. Description of the Related Art

A plastic film that is thin, infrangible, and has high design freedom is very useful in electronic devices, such as flexible or stretchable displays. However, since the plastic film is mainly made of polymers, the plastic film may have disadvantageous mechanical properties.

Thus, to improve the mechanical properties of the plastic film (e.g., polymer film), a method of introducing inorganic particles to the polymer matrix is generally used in the manufacturing of the polymer film. However, the hydrophilic surface properties of the inorganic particles may cause particle aggregation. To prevent or reduce this aggregation, the inorganic particles may be modified to have hydrophobic properties. Alternatively, the surfaces of the inorganic particles may be treated with a material that is compatible with the matrix. However, even when these strategies are used, the problem of particle aggregation still exists.

Therefore, development of a composition for forming a polymer film and a polymer film prepared using the composition is desired, in which the composition exhibits excellent dispersibility without aggregation of inorganic particles, and the polymer film has excellent mechanical properties.

SUMMARY

One or more aspects of example embodiments of the present disclosure are directed toward a composition for forming a polymer film, the composition having excellent dispersibility; a polymer film prepared using the composition, the polymer film having improved mechanical properties; and an electronic device including the polymer film.

Additional aspects will be set forth in part in the description which follows and, in part, will be apparent from the description, or may be learned by practice of the presented embodiments.

One or more example embodiments of the present disclosure provide a composition for forming a polymer film, the composition including an inorganic particle grafted with an organosiloxane polymer represented by Formula 1; and a polymer matrix having a vinylene-based repeating unit:

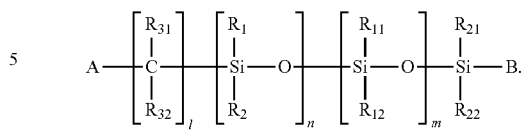

Formula 1

In Formula 1,

A may be a moiety grafted to the inorganic particle,

B may be a moiety capable of reacting with the polymer matrix, but excludes a carbon-carbon double bond, $R_1$ and $R_2$ may each independently be selected from a substituted or unsubstituted $C_1$-$C_{10}$ alkyl group and a substituted or unsubstituted $C_1$-$C_{10}$ alkoxy group, $R_{11}$, $R_{12}$, $R_{21}$, $R_{22}$, $R_{31}$, and $R_{32}$ may each independently be selected from moiety B, a substituted or unsubstituted $C_1$-$C_{10}$ alkyl group, and a substituted or unsubstituted $C_1$-$C_{10}$ alkoxy group, wherein at least one selected from $R_{11}$ and $R_{12}$ may be moiety B, and, l, n, and m denote the numbers of respective repeating units, wherein l may be an integer selected from 0 to 100, n may be an integer selected from 1 to 1,500, and m may be an integer selected from 0 to 1,500.

One or more example embodiments of the present disclosure provide a polymer film prepared by curing the composition for forming the polymer film.

One or more example embodiments of the present disclosure provide an electronic device including the polymer film.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
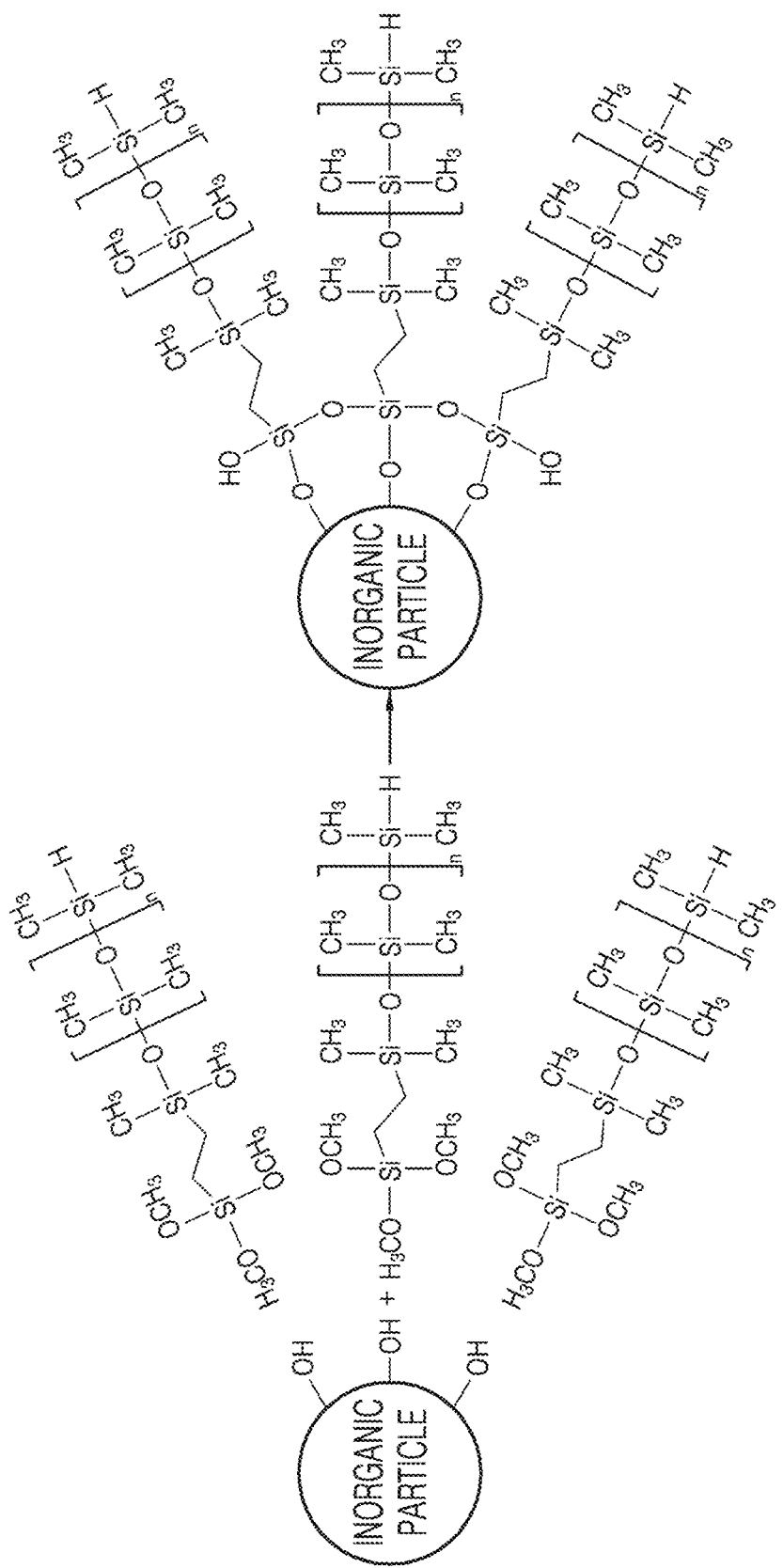
FIG. 1 is a schematic view illustrating an inorganic particle grafted with an organosiloxane polymer according to an embodiment.

Reference will now be made in further detail to example embodiments, examples of which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the drawings, to explain aspects of the present description. Expressions such as "at least one of", and "one of", when preceding a list of elements, modify the entire list of elements and do not modify the individual elements of the list.

One or more embodiments of the present disclosure provide a composition for forming a polymer film, the composition including:

an inorganic particle grafted with an organosiloxane polymer represented by Formula 1; and a polymer matrix having a vinylene-based repeating unit:

Formula 1

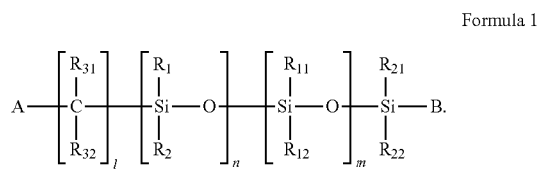

In Formula 1, moiety A may be a moiety grafted to the inorganic particle, and moiety B may be a moiety capable of reacting with the polymer matrix.

For example, in Formula 1, moiety A may be a moiety grafted to the inorganic particle via a condensation reaction, and moiety B may be a moiety capable of reacting with the polymer matrix via an addition reaction (e.g., a hydrosilylation reaction).

In Formula 1, moiety B may exclude a carbon-carbon double bond. For example, B may be a moiety capable of reacting with the polymer matrix, with the proviso that B does not include a carbon-carbon double bond. When moiety B in Formula 1 includes a carbon-carbon double bond, there may be a disadvantage in that a separate cross-linking agent (e.g., a compound having a —Si—H group) is necessary to form a polymer film. When the composition for forming the polymer film according to embodiments of the present disclosure includes the inorganic particle grafted with the organosiloxane polymer having a moiety B that is capable of reacting with the polymer matrix, an organosiloxane polymer film having improved mechanical properties may be prepared without using a separate cross-linking agent. As used herein, "mechanical properties" may refer to extension/restoration (%), Shore A hardness, and/or shore D hardness, but the types or kinds of mechanical properties are not limited thereto.

In some embodiments, since the organosiloxane polymer of Formula 1 includes not only moiety A grafted to the inorganic particle, but also moiety B capable of reacting with the polymer matrix, a chemical network between the inorganic particle and the polymer matrix may be formed through an addition reaction (e.g., a hydrosilylation reaction) between moiety B and the vinylene-based repeating unit of the polymer matrix. Accordingly, the polymer film prepared using the composition of the present disclosure may prevent or reduce aggregation of the inorganic particles, and thus the polymer film may exhibit improved cross-linking between the inorganic particle and the polymer matrix, thereby having high (e.g., improved) mechanical properties.

In some embodiments, moiety A in Formula 1 may be a moiety derived from a compound having at least one selected from an alkoxysilyl group, an epoxy group, and an amine group.

For example, moiety A in Formula 1 may be a moiety derived from a compound having an alkoxysilyl group.

Non-limiting examples of the compound having an alkoxysilyl group may include trimethoxysilane, triethoxysilane, methyldiethoxysilane, methyldimethoxysilane, phenyldimethoxysilane, (trimethylsiloxy)methylmethoxysilane, and (trimethylsiloxy)diethoxysilane.

In some embodiments, moiety B in Formula 1 may be a hydrogen atom.

In Formula 1, $R_1$ and $R_2$ may each independently be selected from a substituted or unsubstituted $C_1$-$C_{10}$ alkyl group and a substituted or unsubstituted $C_1$-$C_{10}$ alkoxy group, $R_{11}$, $R_{12}$, $R_{21}$, $R_{22}$, $R_{31}$, and $R_{32}$ may each independently be selected from moiety B, a substituted or unsubstituted $C_1$-$C_{10}$ alkyl group, and a substituted or unsubstituted $C_1$-$C_{10}$ alkoxy group, wherein at least one selected from $R_{11}$ and $R_{12}$ may be moiety B. $R_{11}$, $R_{12}$, $R_{21}$, $R_{22}$, $R_{31}$, and/or $R_{32}$ may be moiety B in addition to the moiety B already shown in Formula 1.

For example, in Formula 1, $R_1$ and $R_2$ may each independently be selected from a methyl group, an ethyl group, an isopropyl group, an n-butyl group, a sec-butyl group, a tert-butyl group, a methoxy group, an ethoxy group, an isopropoxy group, an n-butoxy group, a sec-butoxy group, and a tert-butoxy group, and $R_{11}$, $R_{12}$, $R_{21}$, $R_{22}$, $R_{31}$, and $R_{32}$ may each independently be selected from moiety B, a methyl group, an ethyl group, an isopropyl group, an n-butyl group, a sec-butyl group, a tert-butyl group, a methoxy group, an ethoxy group, an isopropoxy group, an n-butoxy group, a sec-butoxy group, and a tert-butoxy group.

In some embodiments, in Formula 1, $R_1$ and $R_2$ may each independently be selected from a methyl group, an ethyl group, an isopropyl group, an n-butyl group, a sec-butyl group, a tert-butyl group, a methoxy group, an ethoxy group, an isopropoxy group, an n-butoxy group, a sec-butoxy group, and a tert-butoxy group, and $R_{11}$, $R_{12}$, $R_{21}$, $R_{22}$, $R_{31}$, and $R_{32}$ may each independently be selected from moiety B, a methyl group, and an ethyl group.

The inorganic particle may include a group represented by Formula 2 bonded to a surface of the inorganic particle:

Formula 2

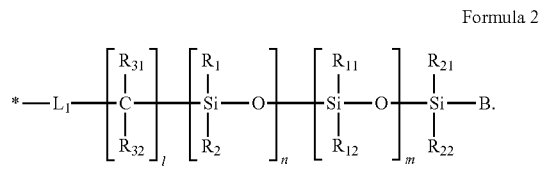

In Formula 2, $R_1$, $R_2$, $R_{11}$, $R_{12}$, $R_{21}$, $R_{22}$, $R_{31}$, $R_{32}$, l, n, m, and B may be the same as defined herein in connection with Formula 1.

The group of Formula 2 may represent an inorganic particle-grafted form through a reaction between the organosiloxane polymer of Formula 1 and the inorganic particle. For example, the group of Formula 2 may correspond to a reaction residue (e.g., reaction product) resulting from the reaction between the organosiloxane polymer of Formula 1 and the inorganic particle.

In Formula 2,*denotes a binding site to the inorganic particle.

In Formula 2, $L_1$ may be a group represented by one selected from Formulae 3A to 3E:

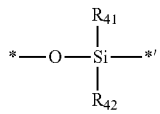

Formula 3A

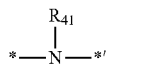

Formula 3B

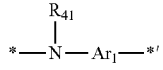

Formula 3C

*—O—*'

Formula 3D

*—O—Ar$_1$—*'

Formula 3E

In Formulae 3A to 3E, $R_{41}$ and $R_{42}$ may each independently be selected from a hydrogen atom, a substituted or unsubstituted $C_1$-$C_{10}$ alkyl group, and a substituted or unsubstituted $C_1$-$C_{10}$ alkoxy group, and

* and *' may each denote a binding site to a neighboring atom.

For example, in Formulae 3A to 3C, $R_{41}$ and $R_{42}$ may each independently be selected from a hydrogen atom, a methyl group, an ethyl group, an isopropyl group, an n-butyl group, a sec-butyl group, a tert-butyl group, a methoxy group, an ethoxy group, an isopropoxy group, an n-butoxy group, a sec-butoxy group, and a tert-butoxy group.

In Formula 3A, at least one selected from $R_{41}$ and $R_{42}$ may be cross-linked with at least one selected from neighboring $R_{41}$ and $R_{42}$. For example, in Formula 3A, at least one selected from $R_{41}$ and $R_{42}$ may be cross-linked with a respective other of $R_{41}$ and $R_{42}$.

FIG. 1 illustrates an embodiment of the grafting reaction between the inorganic particle (e.g., fumed or pyrogenic silica having surface silanol groups) and the organosiloxane polymer of Formula 1 (e.g., resulting in the grafted organosiloxane polymer of Formula 2 wherein $L_1$ is the group represented by Formula 3A). The organosiloxane polymer of Formula 1 may be cross-linked with a neighboring organosiloxane polymer, for example, via a Si—O bond.

In Formulae 3C and 3E, $Ar_1$ may be a substituted or unsubstituted $C_6$-$C_{20}$ arylene group.

In some embodiments, in Formulae 3C and 3E, $Ar_1$ may be selected from:

a phenylene and a naphthalene; and a phenylene and a naphthalene, each substituted with at least one selected from a deuterium atom, —F, —Cl, —Br, —I, a hydroxyl group, a cyano group, a nitro group, an amino group, a $C_1$-$C_{10}$ alkyl group, and a $C_1$-$C_{10}$ alkoxy group, but $Ar_1$ is not limited thereto.

Non-limiting examples of the substituents of the substituted $C_1$-$C_{10}$ alkyl group, the substituted $C_1$-$C_{10}$ alkoxy group, and the substituted $C_6$-$C_{20}$ arylene group may include a deuterium atom, a cyano group, an amino group, an amidino group, a nitro group, a $C_1$-$C_{10}$ alkyl group, and/or a $C_1$-$C_{10}$ alkoxy group.

In Formula 1, l denotes the number of repeating units of —C($R_{31}$)($R_{32}$)—, n denotes the number of repeating units of —Si($R_1$)($R_2$)—O—, and m denotes the number of repeating units of —Si($R_{11}$)($R_{12}$)—O—.

In Formula 1, l may be an integer selected from 0 to 100, and in some embodiments, 1 to 10; n may be an integer selected from 1 to 1,500, and in some embodiments, 10 to 500; and m may be an integer selected from 0 to 1,500, and in some embodiments, 10 to 500. When l, n, and m are each an integer within each range described above, the organosiloxane polymer of Formula 1 may be compatible with the polymer matrix in a good manner (e.g., highly compatible).

The organosiloxane polymer of Formula 1 may have a weight-average molecular weight of about 100 g/mol to about 100,000 g/mol, and in some embodiments, about 500 g/mol to about 5,000 g/mol. When the organosiloxane polymer of Formula 1 has a weight average molecular weight within the range described above, a polymer dry brush that disturbs the compatibility of the organosiloxane polymer of Formula 1 with the polymer matrix may not be formed, even in the case where the organosiloxane polymer of Formula 1 is grafted to the inorganic particle. In this regard, the organosiloxane polymer of Formula 1 may be grafted to the inorganic particle without undue difficulty caused by steric hindrance.

The inorganic particle may be selected from silica ($SiO_2$), $TiO_2$, $ZnO_2$, $ZrO_2$, $Al_2O_3$, and/or combinations thereof. As used herein, the terms "combination", "combination thereof" and "combinations thereof" may refer to a chemical combination (e.g., an alloy or chemical compound), a mixture, or a laminated structure of components.

For example, the inorganic particle may be fumed silica having surface silanol groups (Si—OH).

The term "fumed silica", as used herein, may refer to amorphous silica produced by oxidation of a silicon-containing compound (e.g., pyrogenic silica). Fumed silica may be produced according to Equation 1:

$$SiCl_4 + 2H_2 + O_2 \rightarrow SiO_2 + 4HCl. \quad \text{Equation 1}$$

Silica is generally prepared through a sequential calcining and grinding process, whereas fumed silica is prepared by heating silica and depositing the heated silica on a cold surface at high temperature under vacuum. Non-limiting examples of commercially available fumed silica may include Aerosil@200 and MIBK-ST from Nissan Chemical Company.

In some embodiments, a silanol group on the surface of the fumed silica particles may react with moiety A in the organosiloxane polymer represented by Formula 1, thereby grafting the organosiloxane polymer of Formula 1 onto the fumed silica particles.

The inorganic particle may have an average diameter (e.g., average particle diameter) of about 1 nm to about 100 μm, and in some embodiments, about 3 nm to about 1 μm. When the inorganic particle has an average diameter within the range described above, it prevents or reduces the polymer film from having low dispersibility of the inorganic particles due to aggregation of the inorganic particles. For example, the polymer film may maintain its beneficial mechanical properties, and due to the small specific surface area, the polymer film may also prevent or reduce a decrease in interaction force at the interface between the polymer matrix and the inorganic particle.

The polymer matrix may include a silicon-based polymer having a vinylene-based repeating unit.

For example, the polymer matrix may be selected from polydimethylsiloxane (PDMS), polyvinyl alcohol (PVA), polyvinylchloride (PVC), polytetrafluoroethylene (PTFE), polyurethane (PU), polymethylmethacrylate (PMMA), polyvinylpyrrolidone (PVP), polyethylene oxide (PEO), polyimide (PI), and polyethylene terephthalate (PET), each having a vinylene-based repeating unit, and combinations thereof.

In some embodiments, the polymer matrix may be selected from PDMS, PVA, PVC, PTFE, PU, PMMA, PVP, PEO, PI, and PET, each having at least two vinyl groups, and/or combinations thereof.

The weight ratio (e.g., relative amounts) of the inorganic particle grafted with the organosiloxane polymer to the polymer matrix may be about 0.01:1 to about 1:1, and in some embodiments, about 0.01:1 to about 0.5:1. When the weight ratio of the inorganic particle grafted with the organosiloxane polymer to the polymer matrix is within the range described above, the polymer film prepared therefrom may have maximized or improved mechanical properties.

The inorganic particle grafted with the organosiloxane polymer may have a grafting density of about 0.001 mmol/g to about 1 mmol/g, and in some embodiments, about 0.05 mmol/g to about 0.5 mmol/g. When the grafting density of the inorganic particle grafted with the organosiloxane polymer is within the range described above, the inorganic particle grafted with the organosiloxane polymer may have improved compatibility with the polymer matrix, and may control (e.g., reduce) aggregation of the inorganic particles that are to be cross-linked with the polymer matrix, thereby improving the mechanical properties of the polymer film.

The composition for forming the polymer film may further include at least one solvent and/or catalyst.

Any suitable organic solvent available in the art for forming a polymer film may be used. Non-limiting examples of the solvent may include chloroform, dimethylformamide (DMF), methyl ethyl ketone (MEK), methyl isobutyl ketone (MIBK), dimethylsulfoxide (DMSO), tetrahydrofuran (THF), toluene, acetone, hexane, cyclohexane, dichloromethane, dichloroethane, ethyl acetate, acetonitrile, isopropanol, carbon tetrachloride, xylene, pyridine, pentane, ethyl benzene, bromodichloromethane, trichloroethylene, and hexamethylphosphoamide (HMPA).

Any suitable catalyst available in the art for forming a polymer film may be used. Non-limiting examples of the catalyst may include a catalyst for hydrosilylation (e.g., a catalyst for a curing reaction including a hydrosilylation reaction of the polymer film). Non-limiting examples of the catalyst may include a platinum-based catalyst, a rhodium-based catalyst, a palladium-based catalyst, and combinations (e.g., mixtures) thereof.

Another aspect of embodiments of the present disclosure provides a polymer film prepared using the composition for forming the polymer film.

According to an embodiment of the present disclosure, the polymer film may be formed by a wet process. After the composition for forming the polymer film is prepared, the composition may be applied to a substrate. The composition on the substrate may be cured to form a polymer film on the substrate.

The composition for forming the polymer film may be applied to the substrate according to any suitable method available in the art. For example, the composition for forming the polymer film may be applied to the substrate using a spin coating method, a dipping method, a spray coating method, and/or an ink-jet printing method.

After the composition for forming the polymer film is applied to the substrate, the heat treatment for a curing reaction (e.g., a hydrosilylation reaction) may be performed.

The heat treatment may be performed at a temperature of about 25° C. to about 200° C. for about 0.5 hours to about 48 hours.

During the curing process of the composition for forming the polymer film, the vinylene-based repeating unit of the polymer matrix may participate in an addition reaction with moiety B of Formula 1 (e.g., a hydrosilylation reaction), thereby forming a chemical network between the polymer matrix and the inorganic particle grated with the organosiloxane polymer of Formula 1. Accordingly, the polymer film prepared using the composition for forming the polymer film may have excellent mechanical properties (e.g., high hardness).

When the hardness of the polymer film was measured according to ASTM D2240, the polymer film had a Shore A hardness of about 45 to about 100, and/or a Shore D hardness of about 0 to about 85.

For example, when the hardness of the polymer film was measured according to ASTM D2240, the polymer film had a Shore A hardness of 45 to 90, a Shore A hardness of 45 to 80, a Shore A hardness of 45 to 70, a Shore D hardness of 60 to 85, and/or a Shore D hardness of 60 to 75.

The polymer film described above may be utilized in suitable electronic devices.

Non-limiting examples of such electronic devices may include an organic light-emitting device, a photovoltaic device, an electrochronnic device, an electrophoretic device, an organic thin film transistor, and an organic memory device.

In some embodiments, the polymer film may be utilized as a window film, an adhesion film, a protection film, a barrier film, and/or an impact resistance film in an organic light-emitting device.

Hereinafter, embodiments of the present disclosure will be described in further detail with reference to examples. However, these examples are for illustrative purposes only and are not intended to limit the scope of the present invention. The term "Me", as used in the following synthesis examples, may refer to a methyl group.

EXAMPLES

Synthesis Example 1: Synthesis of Organosiloxane Polymer 1

Synthesis of Initiator 1

Initiator 1 was synthesized according to Equation 1:

Equation 1

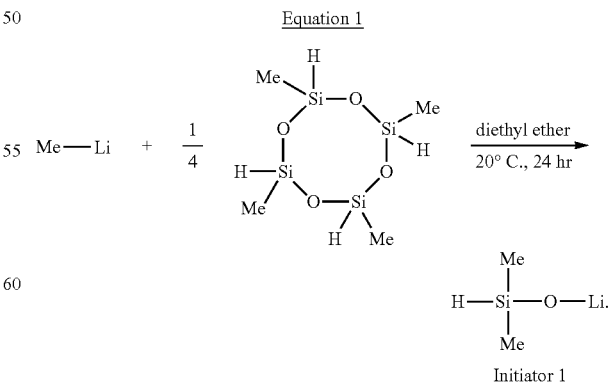

1 g of methyllithium, 2.74 g of tetramethylcyclotetrasiloxane, and 50 mL of diethyl ether were added to a reactor, and the mixture was stirred at a temperature of 20° C. for about 24 hours, thereby synthesizing initiator 1.

Synthesis of Terminator 1

Terminator 1 was synthesized according to Equation 2:

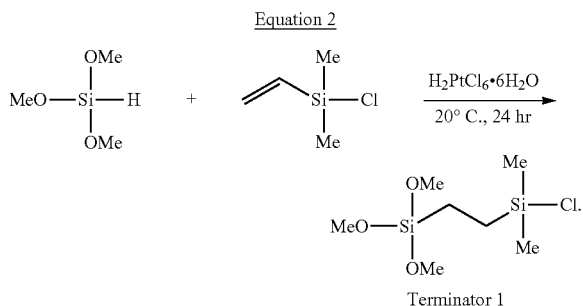

6.11 g of trimethoxysilane, 6.03 g of chlorodimethyl (vinyl)silane, and 0.01 g of $H_2PtCl_6$ were added to a reactor, and the mixture was stirred at a temperature of 20° C. for about 24 hours, thereby synthesizing terminator 1.

Synthesis of Organosiloxane Polymer 1

Organosiloxane polymer 1 was synthesized according to Equation 3:

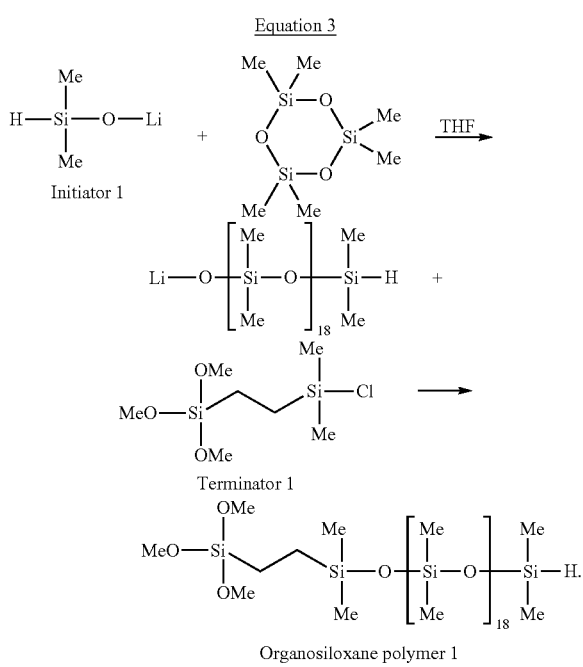

Figure 2:
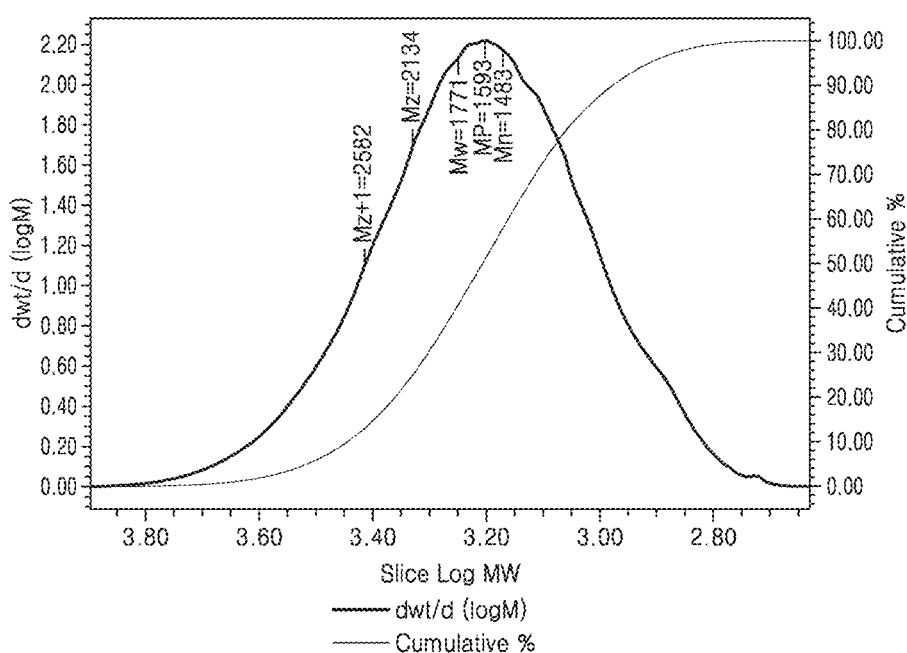
FIG. 2 is a graph and table showing results of evaporative light scattering detector-gel permeation chromatography (ELSD-GPC) of an organosiloxane polymer prepared according to Synthesis Example 1.
Figure 3:
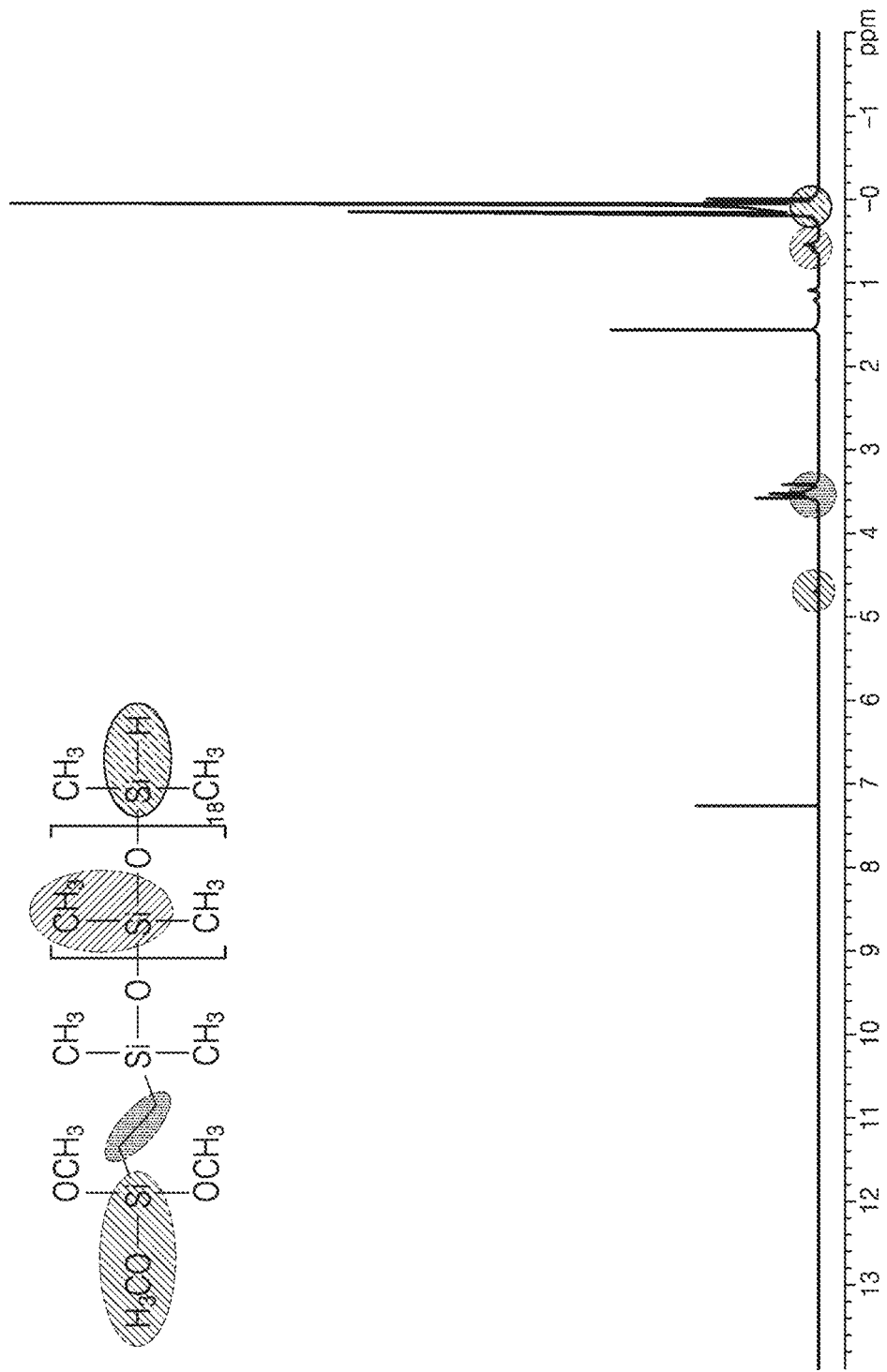
FIG. 3 is a graph of the $^1$H-NMR spectrum of an organosiloxane polymer prepared according to Synthesis Example 1.

3 g of Initiator 1, 39 g of hexamethylcyclotrisiloxane, and 50 mL of THF were added to a reactor, and the mixture was stirred at a temperature of 20° C. for about 24 hours. 19.8 g of terminator 1 was added to the reactor to terminate a reaction, and 50.3 g of organosiloxane polymer 1 was formed. The resulting organosiloxane polymer 1 was confirmed to have a weight average molecular weight of 1,771 g/mol. Organosiloxane polymer 1 was subjected to evaporative light scattering detector-gel permeation chromatography (ELSD-GPC) analysis and $^1$H-NMR spectroscopic analysis, and the results thereof are each shown in FIGS. 2 and 3. The analyses confirmed that the organosiloxane polymer 1 had a terminal end including a trimethoxysilyl group capable of being grafted to the inorganic particle, and a terminal end including a hydrosilyl group (—Si—H) capable of reacting with the polymer matrix.

Synthesis Example 2: Synthesis of Fumed Silica 1

Figure 4:
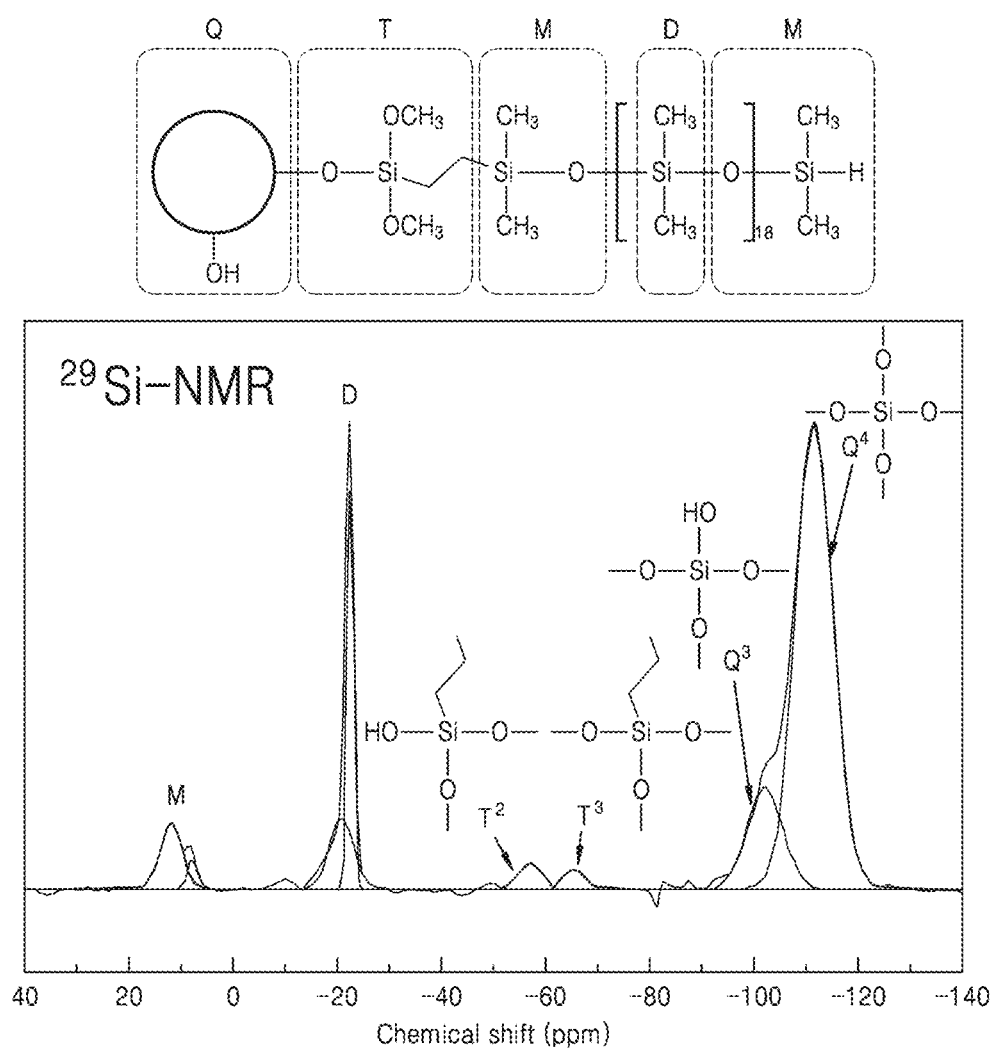
FIG. 4 is a graph of the $^{29}$Si-NMR spectrum of fumed silica 1 grafted with organosiloxane polymer 1 prepared according to Synthesis Example 2.
Figure 5:
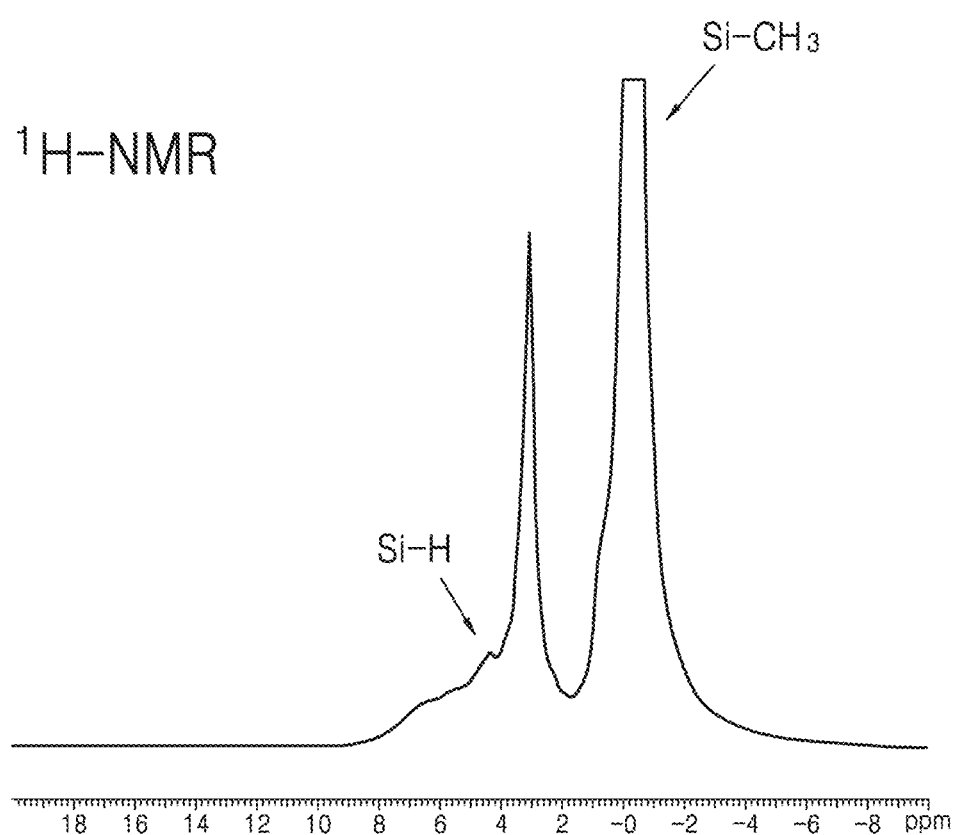
FIG. 5 is a graph of the $^1$H-NMR spectrum of fumed silica 1 grafted with organosiloxane polymer 1 prepared according to Synthesis Example 2.

20 g of organosiloxane polymer 1 from Synthesis Example 1, 20 g of fumed silica (MIBK-ST, available from Nissan Chemical Company), 5 mL of HCl, and 15 mL of water were added to a reactor, and the mixture was stirred at a temperature of 70° C. for 5 hours, such that a condensation reaction between the trimethoxysilyl group of organosiloxane polymer 1 and the silanol group of fumed silica was allowed to proceed, thereby yielding fumed silica 1 grafted with organosiloxane polymer 1. Fumed silica 1 was subjected to $^{29}$Si-NMR and $^1$H-NMR spectroscopic analysis, and the results are shown in FIGS. 4 and 5, respectively.

It was confirmed that fumed silica 1 grafted with organosiloxane polymer 1 had a grafting density of about 0.066 mmol/g.

The grafting density was calculated according to thermogravimetric analysis. The grafting density was obtained based on the amount of decrease in weight of fumed silica 1 and the amount of decrease in weight of organosiloxane polymer 1, according to Equation 1:

$$\frac{\text{Amount of decrease in weight of fumed silica 1/g}}{\text{Weight average molecular weight of organosiloxane polymer 1} \times (\text{amount of decrease in weight of organosiloxane polymer 1/g})} \quad \text{Equation 1}$$

Fumed silica 1 and/or organosiloxane polymer 1 were weighed to 0.005 g, and the amount of decrease in weight thereof was measured using a thermogravimetric analyzer TGA2950 (available from TA Instrument) over a temperature increase from 25° C. to 700° C. at a heating rate of 10° C./minute.

Synthesis Example 3: Synthesis of Fumed Silica 2

15 g of fumed silica (MIBK-ST, available from Nissan Chemical Company), 15 g of polydimethylsiloxane having an epoxy terminal group (represented by the chemical formula below, available from Sigma Aldrich Company), and 0.011 g of $SnCl_2$ (II) were added to a reactor, and the mixture was stirred at a temperature of 130° C. for about 4 hours, such that a reaction between a surface silanol group of fumed silica and the epoxy ring of polydimethylsiloxane was allowed to proceed, thereby yielding fumed silica 2 grafted with polydimethylsiloxane.

Polydimethylsiloxane Having an Epoxy Terminal Group

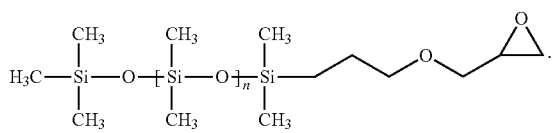

Example 1

3 g of fumed silica 1 from Synthesis Example 2 and 17 g of a polydimethylsiloxane (PDMS) solution (available from Kolon Industry Company) were mixed, and a substrate was coated with the mixed solution. The substrate was heated at a temperature of 120° C. for 1 hour, such that a curing reaction (e.g., a hydrosilylation reaction) was allowed to proceed for 1 hour, thereby preparing a polymer film having a thickness of 100 μm.

Example 2

A polymer film was prepared in substantially the same manner as in Example 1, except that the curing reaction (e.g., hydrosilylation reaction) was allowed to proceed for 24 hours.

Comparative Example 1

A polymer film was prepared in substantially the same manner as in Example 2, except that the fumed silica 2 from Synthesis Example 3 was used instead of the fumed silica 1 from Synthesis Example 2.

Comparative Example 2

A polymer film was prepared in substantially the same manner as in Example 1, except that the fumed silica 1 from Synthesis Example 2 was not used.

Evaluation Example

The polymer films of Examples 1 and 2 and Comparative Examples 1 and 2 were subjected to measurements of extension restoration (%) and Shore A hardness, and the results thereof are shown in Table 1.

To measure the extension restoration (%) of the polymer films of Examples 1 and 2 and Comparative Examples 1 and 2, a sample was prepared in a size of 25 mm (w)×50 mm (h)×100 urn (t), and then, using an tension tester (e.g., UTM: universal testing machine), the sample was subjected to extension/restoration of 30% of the length of the sample for 5 cycles. The test conditions were as follows: (i) extension at 0.5 mms→(ii) maintenance for 60 seconds→(iii) compression at 0.5 mms→(iv) maintenance for 60 seconds. The Shore A hardness values of the polymer films of Examples 1 and 2 and Comparative Examples 1 and 2 were then measured according to ASTM D2240.

TABLE 1

| Polymer film | Extension restoration (%) | Shore A hardness |
|---|---|---|
| Example 1 | 96.5 | 50.3 |
| Example 2 | 98.7 | 63.8 |
| Comparative Example 1 | Broken | 44.4 |
| Comparative Example 2 | 95.1% | 39.1 |

Referring to Table 1, it was confirmed that the polymer films of Examples 1 and 2, which formed a chemical network with the PDMS polymer matrix and fumed silica 1, had better Shore A hardness values than the polymer films of Comparative Examples 1 and 2. In addition, due to the high dispersibility of fumed silica 1, the polymer films of Examples 1 and 2 were found to have excellent extension restoration (%) properties compared to the polymer film of Comparative Example 2.

Figure 6:
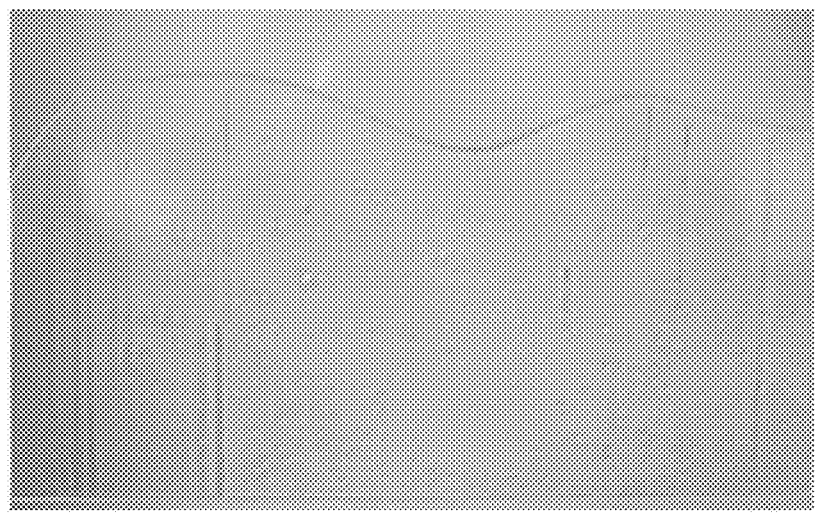
FIG. 6 is an image of a polymer film prepared according to Comparative Example 1, the polymer film having line defects.
Figure 7A:
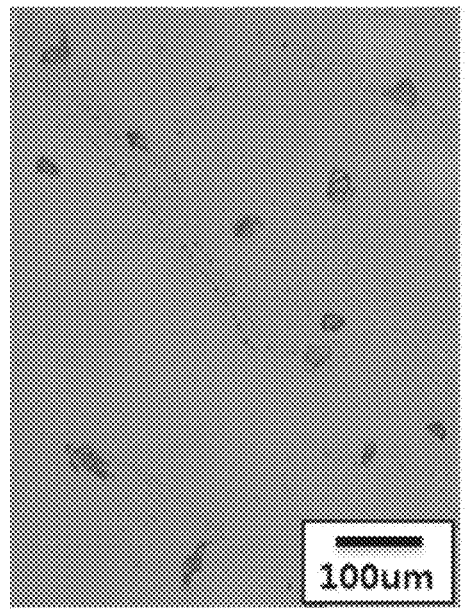
FIGS. 7A-7B are optical microscope images showing a polymer film prepared according to Comparative Example 1, in which the formation of particle aggregates in a size of tens or hundreds of micrometers (μm) causes line defects.
Figure 7B:
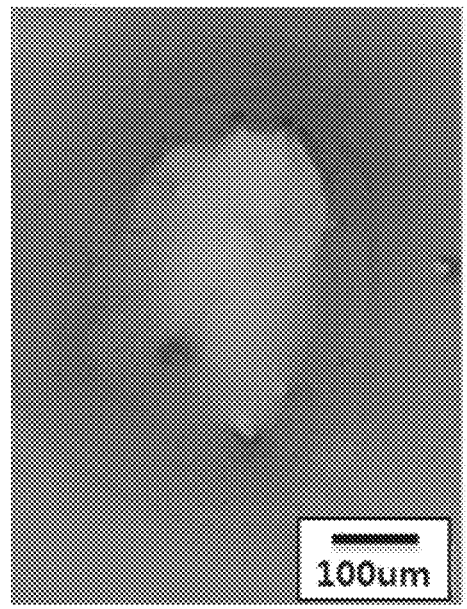
Figure 7C:
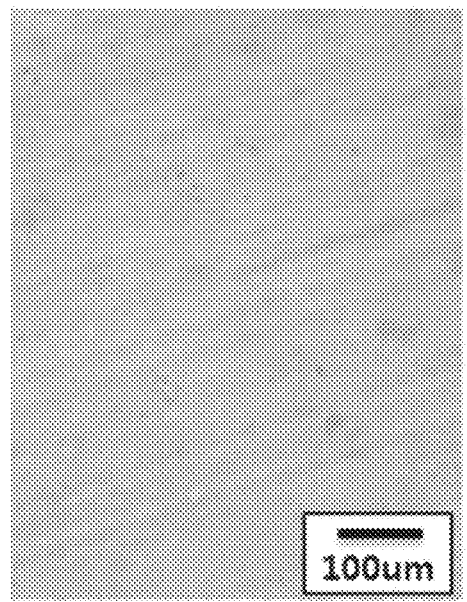
FIG. 7C is an optical microscope image showing a polymer film prepared according to Example 2, in which the formation of particle aggregates is less than in the polymer film of Comparative Example 1.

However, the extension restoration (%) of the polymer film of Comparative Example 1 was not able to be measured since the film was broken during the measurement. FIG. 6 shows an image of the polymer film of Comparative Example 1, the polymer film having a line defect. FIGS. 7A-7B are optical microscope images of the polymer film of Comparative Example 1, showing line defects caused by particle aggregates formed in a size of tens or hundreds of micrometers (μm), and FIG. 7C is an optical microscope image of the polymer film of Example 2, showing that the degree of particle aggregation was less (e.g., reduced) compared to the polymer film of Comparative Example 1.

Thus, referring to Table 1 and FIGS. 6 and 7A-7C, it was confirmed that the polymer film of Comparative Example 1 including fumed silica 2, which did not form a chemical network with the PDMS polymer matrix, experienced aggregation of the inorganic particles, which resulted in a reduction in dispersibility and breakage of the film during measurement of extension restoration (%), as well as low hardness.

As described according to one or more of the above example embodiments, a composition for forming a polymer film may have high dispersibility, and thus a polymer film prepared using the composition may also have improved mechanical properties.

The use of "may" when describing embodiments of the present disclosure refers to "one or more embodiments of the present disclosure". In addition, as used herein, the terms "use", "using", and "used" may be considered synonymous with the terms "utilize", "utilizing", and "utilized", respectively.

As used herein, the terms "substantially", "about", and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that example embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the drawings, it will be understood by those of ordinary skill in the art that various changes in form and details may be made therein without departing from the spirit and scope as defined by the following claims and equivalents thereof.

What is claimed is:

1. A composition for forming a polymer film, the composition comprising:
    an inorganic particle grafted with an organosiloxane polymer represented by Formula 1; and a polymer matrix having a vinylene-based repeating unit:

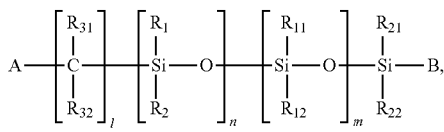

Formula 1 wherein, in Formula 1,

A is a moiety grafted to the inorganic particle,

B is a moiety capable of reacting with the polymer matrix, but excludes a carbon-carbon double bond, $R_1$ and $R_2$ are each independently selected from a substituted or unsubstituted $C_1$-$C_{10}$ alkyl group and a substituted or unsubstituted $C_1$-$C_{10}$ alkoxy group, $R_{11}$, $R_{12}$, $R_{21}$, $R_{22}$, $R_{31}$, and $R_{32}$ are each independently selected from moiety B, a substituted or unsubstituted $C_1$-$C_{10}$ alkyl group, and a substituted or unsubstituted $C_1$-$C_{10}$ alkoxy group, wherein at least one selected from $R_{11}$ and $R_{12}$ is moiety B, and l, n, and m denote the numbers of respective repeating units, wherein l is an integer selected from 1 to 100, n is an integer selected from 1 to 1,500, ancim is an integer selected from 1 to 1,500.

2. The composition of claim 1, wherein, in Formula 1, A is a moiety derived from a compound having at least one selected from an alkoxysilyl group, an epoxy group, and an amine group.

3. The composition of claim 1, wherein, in Formula 1, moiety B is a hydrogen atom.

4. The composition of claim 1, wherein, in Formula 1, $R_1$ and $R_2$ are each independently selected from a methyl group, an ethyl group, an isopropyl group, an n-butyl group, a sec-butyl group, a tert-butyl group, a methoxy group, an ethoxy group, an isopropoxy group, an n-butoxy group, a sec-butoxy group, and a tert-butoxy group, and $R_{11}$, $R_{12}$, $R_{21}$, $R_{22}$, $R_{31}$, and $R_{32}$ are each independently selected from moiety B, a methyl group, an ethyl group, an isopropyl group, an n-butyl group, a sec-butyl group, a tert-butyl group, a methoxy group, an ethoxy group, an isopropoxy group, an n-butoxy group, a sec-butoxy group, and a tert-butoxy group.

5. The composition of claim 1, wherein, in Formula 1, $R_1$ and $R_2$ are each independently selected from a methyl group, an ethyl group, an isopropyl group, an n-butyl group, a sec-butyl group, a tert-butyl group, a methoxy group, an ethoxy group, an isopropoxy group, an n-butoxy group, a sec-butoxy group, and a tert-butoxy group, and $R_{11}$, $R_{12}$, $R_{21}$, $R_{22}$, $R_{ai}$, and $R_{32}$ are each independently selected from moiety B, a methyl group, and an ethyl group.

6. The composition of claim 1, wherein a group represented by Formula 2 is bonded to a surface of the inorganic particle:

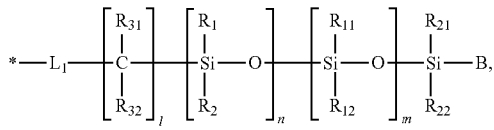

Formula 2

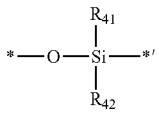

Formula 3A

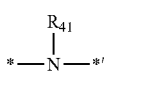

Formula 3B

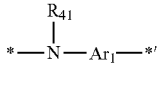

Formula 3C

*—O—*'

Formula 3D

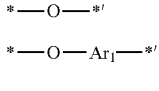

Formula 3E wherein, in Formula 2, $R_1$, $R_2$, $R_{11}$, $R_{12}$, $R_{21}$, $R_{22}$, $R_{31}$, $R_{32}$, l, n, m, and moiety B are the same as in Formula 1,

* denotes a binding site to the inorganic particle, and $L_1$ is a group represented by one selected from Formulae 3A to 3E, wherein, in Formulae 3A to 3E, $R_{41}$ and $R_{42}$ are each independently selected from a hydrogen atom, a substituted or unsubstituted $C_1$-$C_{10}$ alkyl group, and a substituted or unsubstituted $C_1$-$C_{10}$ alkoxy group, $Ar_1$ is a substituted or unsubstituted $C_6$-$C_{20}$ arylene group, and

* and *' each denote a binding site to a neighboring atom.

7. The composition of claim 6, wherein, in Formula 3A, at least one selected from $R_{41}$ and $R_{42}$ is cross-linked with a respective other of $R_{41}$ and $R_{42}$.

8. The composition of claim 1, wherein the organosiloxane polymer of Formula 1 has a weight average molecular weight of about 100 g/mol to about 100,000 g/mol.

9. The composition of claim 1, wherein the inorganic particle is selected from silica ($SiO_2$), $TiO_2$, $ZnO_2$, $ZrO_2$, $Al_2O_3$, and combinations thereof.

10. The composition of claim 1, wherein the inorganic particle has an average diameter of about 1 nm to about 100 μm.

11. The composition of claim 1, wherein the polymer matrix is a silicon-based polymer having a vinylene-based repeating unit.

12. The composition of claim 1, wherein the polymer matrix is selected from polydimethylsiloxane (PDMS), polyvinyl alcohol (PVA), polyvinylchloride (PVC), polytetrafluoroethylene (PTFE), polyurethane (PU), polymethylmethacrylate (PMMA), polyvinylpyrrolidone (PVP), polyethylene oxide (PEO), polyimide (PI), and polyethylene terephthalate (PET), each having a vinylene-based repeating unit, and combinations thereof.

13. The composition of claim 1, wherein a weight ratio of the inorganic particle grafted with the organosiloxane polymer to the polymer matrix is about 0.01:1 to about 1:1.

14. The composition of claim 1, wherein the organosiloxane polymer-grafted inorganic particle has a grafting density of about 0.001 mmol/g to about 1 mmol/g.

15. A polymer film formed by curing the composition of claim 1.

16. The polymer film of claim 15, wherein a chemical network between the inorganic particle and the polymer matrix is formed through an addition reaction between moiety B in the organosiloxane polymer represented by Formula 1 and the vinylene-based repeating unit of the polymer matrix.

17. The polymer film of claim 15, wherein the polymer film has at least one selected from a Shore A hardness of 40 to 100 and a Shore D hardness of 0 to 85, as measured according to ASTM D2240.

18. An electronic device, comprising the polymer film of claim 15.

19. The electronic device of claim 18, wherein the electronic device is selected from an organic light-emitting device, a photovoltaic device, an electrochromic device, an electrophoretic device, an organic thin film transistor, or an organic memory device.

20. The electronic device of claim 19, wherein the polymer film is utilized as a window film, an adhesion film, a protection film, a barrier film, or an impact resistance film of the organic light-emitting device.

\* \* \* \* \*